(12) United States Patent
Xu et al.

(10) Patent No.: US 7,574,190 B2
(45) Date of Patent: Aug. 11, 2009

(54) SIGNAL-PROCESSING ELECTRONICS

(75) Inventors: Zhanping Xu, Netphen (DE); Holger Kraft, Siegen (DE); Tobias Möller, Großenlüder (DE); Jochen Frey, Wetzlar (DE)

(73) Assignee: PMDTechnologies GmbH, Siegen (DE)

( * ) Notice: Subject to any disclaimer, the term of this patent is extended or adjusted under 35 U.S.C. 154(b) by 781 days.

(21) Appl. No.: 11/098,349

(22) Filed: Apr. 4, 2005

(65) Prior Publication Data

US 2005/0233722 A1 Oct. 20, 2005

(30) Foreign Application Priority Data

Apr. 5, 2004 (DE) ................ 10 2004 016 626

(51) Int. Cl.
*H04B 1/26* (2006.01)
(52) U.S. Cl. ........................... 455/323; 455/326
(58) Field of Classification Search ................ None
See application file for complete search history.

(56) References Cited

U.S. PATENT DOCUMENTS 5,687,261 A * 11/1997 Logan ........................... 398/1
5,852,771 A * 12/1998 Jain et al. ..................... 455/330
6,597,899 B2 * 7/2003 Souetinov et al. ............ 455/323

FOREIGN PATENT DOCUMENTS

| DE | 197 04 496 C2 | 2/2001 |
| DE | 100 39 422 C2 | 8/2002 |
| WO | WO 2004/027359 | 9/2003 |

* cited by examiner

*Primary Examiner*—Thanh C Le
(74) *Attorney, Agent, or Firm*—Paul & Paul

(57) ABSTRACT

The present invention relates to a method and an electronic circuit for processing at least two at least partially correlated output signal streams of a mixer, the mixer having at least two signal inputs and at least two electric signal outputs. In order to provide a method and a device or an electronic circuit which enables the correlated signal portions of the output signals of a mixer to be separated from the uncorrelated signal portions undelayed, it is proposed according to the invention that the difference of the output signal streams of the mixer is formed pairwise directly and during the readout of the signal streams and that the circuit has an apparatus for the instantaneous formation of the difference between the signal streams of two mixer outputs in each case.

14 Claims, 3 Drawing Sheets

SIGNAL-PROCESSING ELECTRONICS

The present invention relates to a method and an electronic circuit for processing two at least partially correlated output signal streams of a mixer, the mixer having at least two signal inputs and at least two electric signal outputs.

Electronic and optoelectronic mixer components are known from the state of the art which enable two or more electric and optical or electromagnetic signals to be mixed together and an electric composite signal to be output.

Typically, the at least two input signals of the mixer are correlated with each other. If the two input signals have the same modulation frequency, this is called a homodyne signal mixing. If the signals to be mixed consist exclusively of correlated signal portions, output signals which have signal constituents exclusively correlated to one another are obtained at the outputs of the mixer as a result of the mixing process.

However, it is often the case that one or more of the input signals also have uncorrelated constituents in addition to the correlated signal constituents. Signal portions which occur in only one or one part of an input signal, i.e. are not correlated with the portions of the other input signals, lead to non-correlated signal contributions in the output signals of the mixer.

The amplitudes of the non-correlated signal portions of the output signals are often of the same order of magnitude as or actually greater than the correlated signal portions. Therefore the non-correlated signal portions on the output signals often restrict the dynamic range of the downstream signal-processing unit. In some extreme cases the uncorrelated signal portions can even lead to a depletion of the dynamic range of the signal-processing unit, with the result that a further processing of the correlated mixer signals is no longer possible.

No methods or devices with which the uncorrelated signal portions can be separated undelayed from the correlated signal portions of the output signal streams of a mixer are known from the state of the art.

Vis-à-vis the state of the art, the object of the present invention is to provide a method and a device and/or an electronic circuit which enables the correlated signal portions of the output signals of a mixer to be separated undelayed from the uncorrelated signal portions.

This object is achieved according to the invention in that a method for the processing of at least two at least partially correlated output signal streams of a mixer is provided, the mixer having at least two signal inputs and at least two electric signal outputs and the difference of the output signal streams of the mixer being formed pairwise directly and during the readout of the output signal streams.

Such a development of a method for processing at least two at least partially correlated output signal streams of a mixer is advantageous because, in the pairwise difference formation between the output signal streams of the mixer, only the correlated signal portions contribute to the differential signal. Thus an effective separation of the non-correlated signal constituents from the output signal or the output signals of the mixer is achieved.

The signal obtained during difference formation is equal to double the correlated signal portion of a signal stream of the mixer. Thus the whole dynamic range of the signal-processing unit can be used for the processing of the correlated signals. The suppression of the uncorrelated signal constituents over a wide signal bandwidth is very effective.

A further advantage of the method according to the invention is that it can be applied to all mixers with two outputs and multiples of two outputs.

According to the present invention, during the signal processing the formation of the differential signal takes place instantaneously between two outputs of the mixer in each case, i.e. in real time, and without prior signal integration or multiple scanning.

The described method for the processing of the output signal can be used both for purely electronic mixers, in which the input signals of the mixer are electric signals, and optoelectronic mixers in which at least one of the input signals of the mixer is an optical or electromagnetic signal.

Schottky-diode receivers as used in high-frequency engineering are an example of such mixers.

So-called photonic mixer devices (PMD for short) as disclosed in the German unexamined patent application DE 198 21 974 A1 are a further example of such an optoelectronic mixer. The disclosure content of this published document is hereby incorporated in full by reference into the present application.

Such a photonic mixer device has a photoconductive material in which the incident electromagnetic radiation produces charge carriers. These photogenerated charge carriers are moved in an electric field applied to the modulation gates of the photonic mixer device. The flowing stream is measured. The current and/or voltage measurement can take place both at the modulation gates themselves and at additional readout electrodes or gates. In the case of the measurement method known from the state of the art for determining the phase and amplitude of the incident intensity-modulated electromagnetic radiation, it is necessary to supply the modulation gates of the photonic mixer device with one or also two amplitude-modulated voltage signals phase-displaced by 180° which are correlated with the intensity modulation of the incident electromagnetic radiation. Correlation in the simplest case means that the amplitude or intensity modulations of the bias voltage of the photonic mixer device and the electromagnetic radiation have the same temporal course. This is also called rigid phase coupling between the optical and the electric signal. The electric signal can therefore also be called reference signal. The voltage or current signal measured via the readout electrodes is a function of the product of the number of generated charge carriers and the modulation or reference voltage. The measured signal is therefore a function of the intensity of the incident electromagnetic wave and the phase difference between the electromagnetic wave and the electric reference signal. If the quadrature components of the incident signal are measured simultaneously with two neighbouring photonic mixer devices, the phase difference between the electromagnetic wave and the electric reference signal is obtained directly. However, the quadrature components can also be measured consecutively with a single photonic mixer device if the phase of the reference signal is displaced by 90° between the two measurements.

A version of the invention is particularly preferred in which the readout electrodes of the mixer are diodes. Such mixers have only one current direction, which is the same for all readout electrodes, at each readout electrode. The method according to the invention is therefore particularly advantageously applicable to them.

In order to generate the pairwise difference of two outputs of the mixer directly during the readout, the signal stream of one of the outputs of the mixer is preferably inverted or mirrored and can then be passed directly with the signal of the second output to a common summation point.

A version of the present invention is particularly advantageous in which the amplitude of the signal stream of a first output of the mixer is measured. If the previously described photonic mixer device is considered, the amplitude of the signal stream of one of the readout electrodes of the device is measured.

In order to subsequently be able to form the difference between the signal stream of the first output of the mixer and the signal stream of the second output of the mixer, the signal stream of the first output is converted into a voltage signal which is a function of the signal stream. The conversion of the signal stream into a voltage signal can take place with the help of a regulator. The amplitude of the voltage signal is regulated with the help of a control voltage applied to the voltage input of the regulator.

The voltage signal is then converted preferably with the help of a voltage-to-current converter into a current signal which is again a function of the voltage signal. The converted current signal behind the voltage-to-current converter has a sign opposite to the signal stream of the second mixer output. The voltage-to-current converter characteristic can expediently be influenced via a control input.

A regulation of the regulator and of the voltage-to-current converter is particularly preferred with which the signal stream of the first mixer output and the converted current signal behind the voltage-to-current converter have the same value. Thus the uncorrelated signal portions are completely suppressed. However, other degrees of signal suppression can also be set.

In a particularly preferred version of the invention, the signal stream of the second mixer output and the converted current signal or the inverted signal stream of the first mixer output are passed to a first summation point. The current flowing via the third terminal of the summation point now corresponds to the difference between the two at least partially correlated signal streams of the first and the second mixer output. The differential signal is equal to twice the correlated signal portion of a mixer output. This difference method for separating the correlated from the non-correlated signal portions is also advantageous because it is largely insensitive to unbalances in the two signal paths as can occur on the mixer for example because of the production technique.

It is expedient if the difference of the signal streams behind the summation point is integrated to form a voltage signal.

In a particularly preferred version of the invention, the differential signal is further processed in a signal-processing unit behind the summation point or the integrator.

It is advantageous if two current signals dependent on the voltage signal of the first mixer output are produced. This can take place for example via a second output at the voltage-to-current converter or via an additional replicator behind the voltage-to-current converter. It is to be borne in mind that both thus-produced current signals have the same amplitude. If only one of the two current signals is integrated without passing it to the first summation point, a voltage signal is obtained which is a function of the sum of correlated and uncorrelated signal portions. This signal can be used for example for regulating the mixer system.

In a particularly preferred version of the invention, the sum of the two signal streams is formed in addition to the difference of the two signal streams of the two mixer outputs.

To this end it is expedient if the current signals of the first and the second mixer output are replicated. One of the replicated signal streams in each case of a respective mixer output is passed to a second summation point, As the two signal streams on the second summation point have the same sign, the sum of the two signal streams is formed here directly. If the summing signal is integrated further behind the second summation point, a voltage signal is obtained which is equal to the sum of the two signal streams behind the summation point.

During sum formation, the contributions of the correlated signal portions of the two signal streams cancel each other out, while the summing signal corresponds to double the non-correlated signal contribution of one of the signal streams.

With regard to the device, the object is achieved in that an electronic circuit for the processing of at least two at least partially correlated output signal streams of a mixer is provided, the mixer having at least two signal inputs and two electric signal outputs and the circuit having an apparatus for forming the pairwise difference between the output signal streams of the mixer.

A version of the invention is particularly preferred in which the readout electrodes of the mixer are diodes. Such mixers have only one current direction, which is the same for all readout electrodes, at each readout electrode. Such a mixer is therefore particularly advantageously operable with the device according to the invention.

It is expedient if the electronic circuit according to the invention has an apparatus for inverting the current signal of a first mixer output, the apparatus being connected to a first mixer output for the inversion.

It is advantageous if the apparatus has for the inversion an apparatus for the conversion of the signal stream of the first output into a voltage signal dependent on the signal stream, the apparatus being connected to the first output of the mixer for the conversion. The apparatus for the conversion of the signal stream into a voltage signal dependent on the signal stream can be a regulator component, the characteristic of which can be influenced by the voltage applied to the voltage input. To produce an inverted current signal, a voltage-to-current converter is provided which converts the voltage signal into a current signal dependent on the voltage signal. It is expedient if the voltage-to-current converter characteristic of the voltage-to-current converter can be regulated.

The output of the voltage-to-current converter and the second output of the mixer are connected to a summation point with the result that a current which corresponds to the difference of the two signal streams flows via the third terminal of the summation point.

It is expedient if an integrator for integrating the difference of the currents to form a voltage signal is provided behind the summation point.

A version of the invention is particularly preferred in which the voltage-to-current converter has two outputs which output an inverted current signal proportional to the signal stream of the first output of the mixer.

Alternatively, a current replicator can be connected to the output of the voltage-to-current converter.

It is expedient if an integrator which integrates one of the two current signals to form a voltage signal is provided behind one output of the voltage-to-current converters or the current replicator. This integrated voltage signal is a function of the correlated and non-correlated signal portions of the first signal stream.

In a particularly preferred version of the invention, a device for the production of the sum of the signal streams of the two mixer outputs is also provided.

Such a device can be realized by replicators behind the mixer outputs for the production in each case of two identical current signals of the mixer outputs. In each case one of the two current signals of each mixer output is connected to a second summation point. The third terminal of the summation point is connected to an integrator which integrates the summed current signal to form a voltage signal.

A version of the present invention is particularly preferred in which the electronic circuit is an integrated circuit. The integrated circuit can be produced for example in known silicon technology. It is expedient if the electronic circuit is integrated with the electronic or optoelectronic mixer elements on one component. Several mixer elements can also each be integrated with an electronic circuit for difference and sum formation in one component. Thus a highly integrated electronic component can be produced which has a two-dimensional arrangement of mixers, e.g. for recording a video signal. The individual mixers which form the picture elements and the associated circuits are integrated for sum and difference formation.

Further features, advantages and applications of the present invention are clear from the following description of preferred versions and the associated figures.

Figure 1:
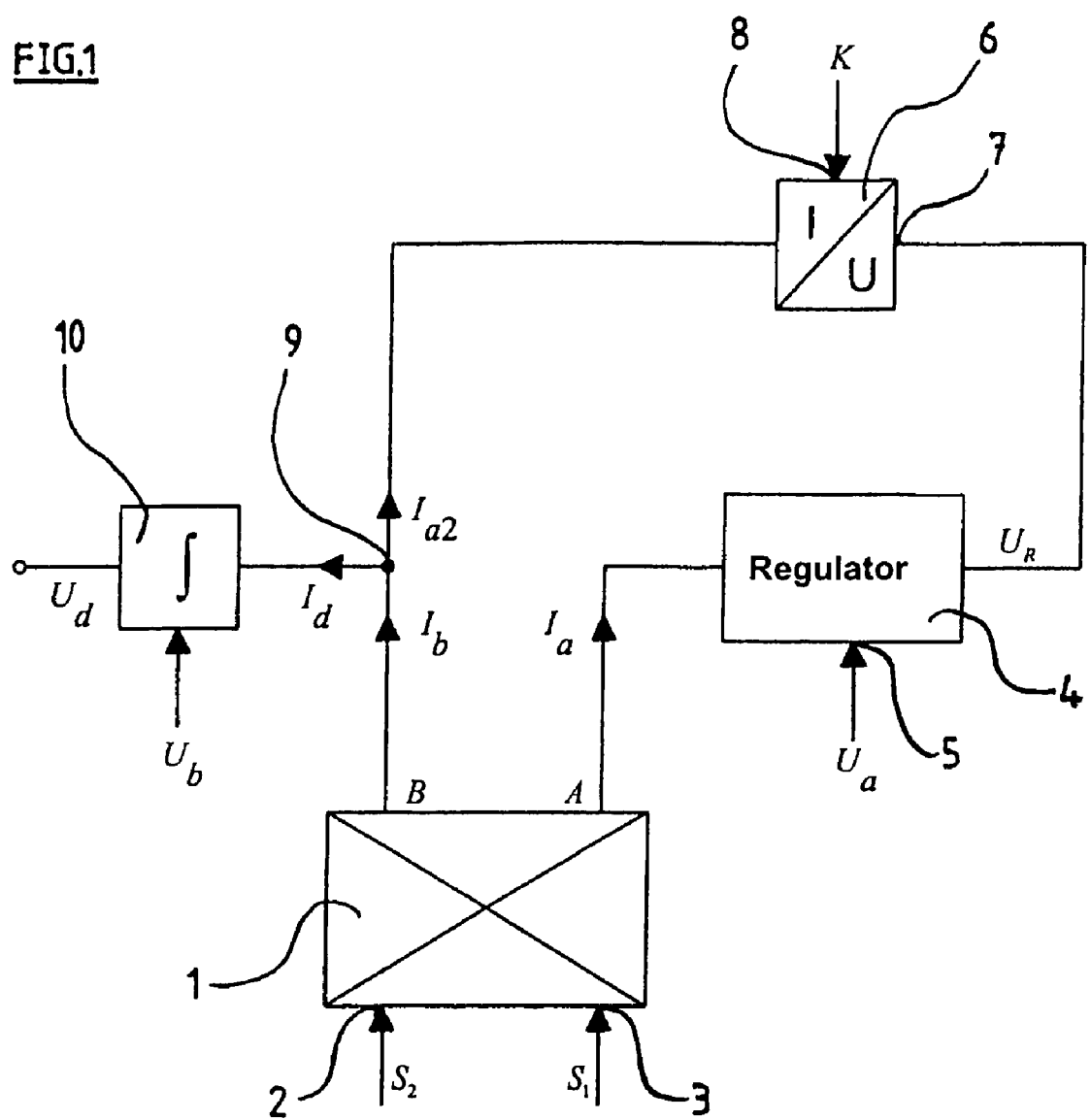
FIG. 1 shows a schematic circuit structure of a first version of the invention.

A schematic structure of a circuit structure according to the invention is shown in FIG. 1. In the shown version, the mixer 1 has two signal inputs 2, 3 and two signal outputs A, B.

In the shown version, input signal S1 is an electric reference signal while input signal S2 is an electromagnetic wave.

Figure 2:
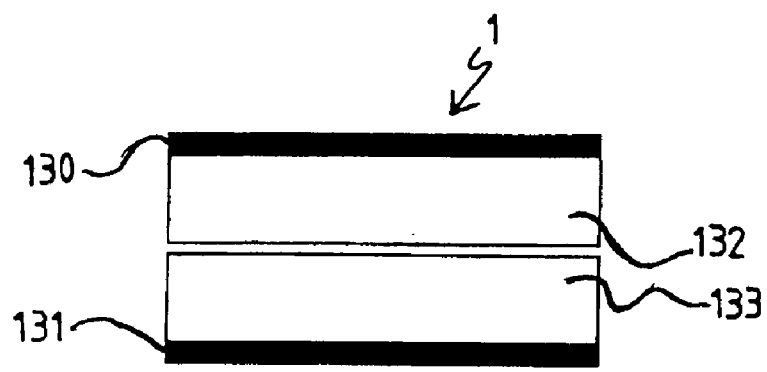
FIG. 2 shows a schematic view of a photonic mixer device.

For this reason, mixer 1 is designed as a photonic mixer device as shown in FIG. 2. It has a photosensitive layer for signal S1 and two modulation gates 132, 133 for the electric reference signal S2. The two modulation gates 132, 133 of the mixer 1 are fed with signals of the electric reference signal S2 phase-displaced by 180° vis-à-vis one another. The modulation gates 132, 133 are gates transparent for the incident electromagnetic radiation S1 which are arranged above the photosensitive layer. The photonic mixer device also has two readout electrodes 130, 131 which are arranged adjacent to the modulation gates and are in electric contact with the photoconductive layer. The readout electrodes 130, 131 of the photonic mixer device have the current-voltage characteristic of a diode in the shown version. The readout electrodes 130, 131 of the photonic mixer device 1 form the signal outputs A and B of the mixer 1.

In an alternative version, the readout electrodes 130, 131 of the photonic mixer device can be fed simultaneously with the electric reference signal S2, with the result that the modulation gates 132, 133 are dispensed with. In this case input 2 of the reference signal S2 is identical to the signal outputs A and B of the mixer 1.

To understand the circuit shown in FIG. 1, firstly the signal stream $I_a$ of the mixer output A is followed. Signal stream $I_a$ is passed to a regulator 4 which converts the signal stream $I_a$ into a voltage signal $U_R$ dependent thereon. The characteristic of the regulator 4 can be controlled with the help of the voltage $U_a$ applied to the voltage input 5. The voltage signal $U_R$ output by the regulator is a function of the amplitude of the signal stream $I_a$.

The output of the regulator 4 is connected to the voltage input 7 of a voltage-to-current converter 6. This converts the voltage signal $U_R$ into a current signal $I_{a2}$. The current signal $I_{a2}$ is dependent on the input voltage $U_R$ of the voltage-to-current converter 6 and thus on the current signal $I_a$ of output A of the mixer 1. The voltage-to-current converter characteristic of the voltage-to-current converter 6 can be set with the help of the characteristic input 8 and a control signal K applied there.

By suitably setting the characteristics of the regulator 4 and the voltage-to-current converter 6, the current $I_{a2}$ can be set such that it is equal in value to the signal stream $I_a$ of the output A of the mixer 1.

The current output $I_{a2}$ of the voltage-to-current converter 6 is passed to a summation point 9. The second signal stream $I_b$ of the output B of the mixer 1 is likewise connected to the summation point 9. It is to be borne in mind that the current signal $I_{a2}$ has an opposite sign to the signal stream $I_b$ of the output B of the mixer 1. Thus the current which flows out via the third terminal of the summation point 9 is equal to the difference between the currents $I_b$ and $I_{a2}$. This differential flow $I_d$ is twice as large as the correlated signal portion of a signal stream of the mixer 1.

The differential flow $I_d$ flowing out from summation point 9 is integrated to form a voltage signal $U_d$ with the help of an integrator 10.

During the formation of the difference between the currents $I_b$ and $I_{a2}$ at the summation point 9, all non-correlated signal contributions cease. Thus an easy separation of the correlated from the non-correlated signal portions can be achieved. The voltage signal $U_d$ to be tapped at the integrator can therefore subsequently be processed without non-correlated signal portions depleting the dynamic range of the downstream evaluation electronics.

Figure 3:
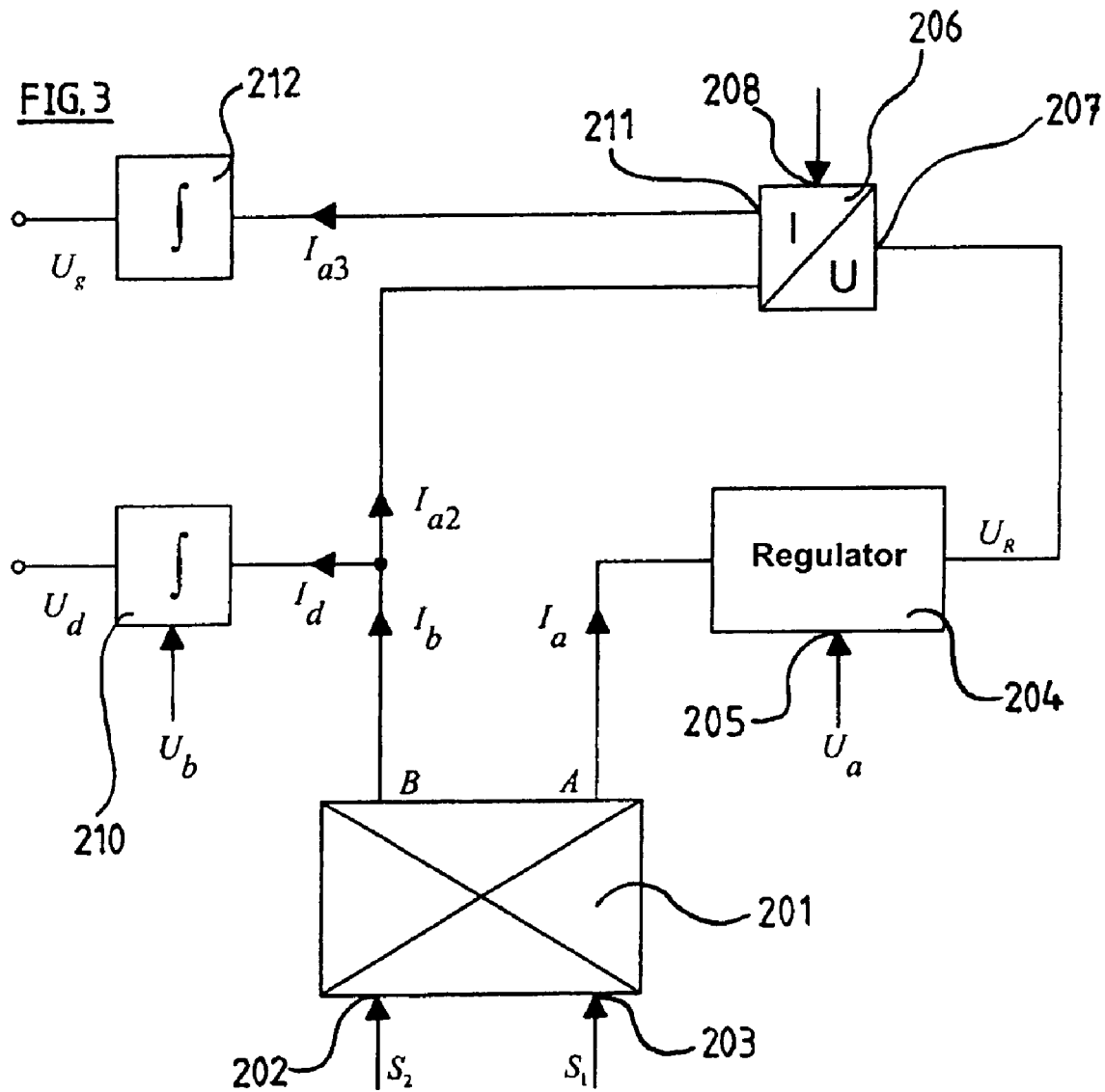
FIG. 3 shows a schematic circuit structure of a second version of the invention.

If information about the whole signal is also be obtained in addition to the correlated signal portion, a circuit as represented in FIG. 3 can be used. The circuit structure in FIG. 3 differs from the circuit shown in FIG. 1 by virtue of a second output 211 of the voltage-to-current converter 206. The current signal $I_{a3}$ output at the second output 211 is likewise proportional or equal to the value of the signal stream $I_a$ of output A of the mixer 201. The current signal $I_{a3}$ is integrated with the help of an integrator 212 to form a voltage signal $U_g$ which contains data about both the correlated and the non-correlated signal portions.

Figure 4:
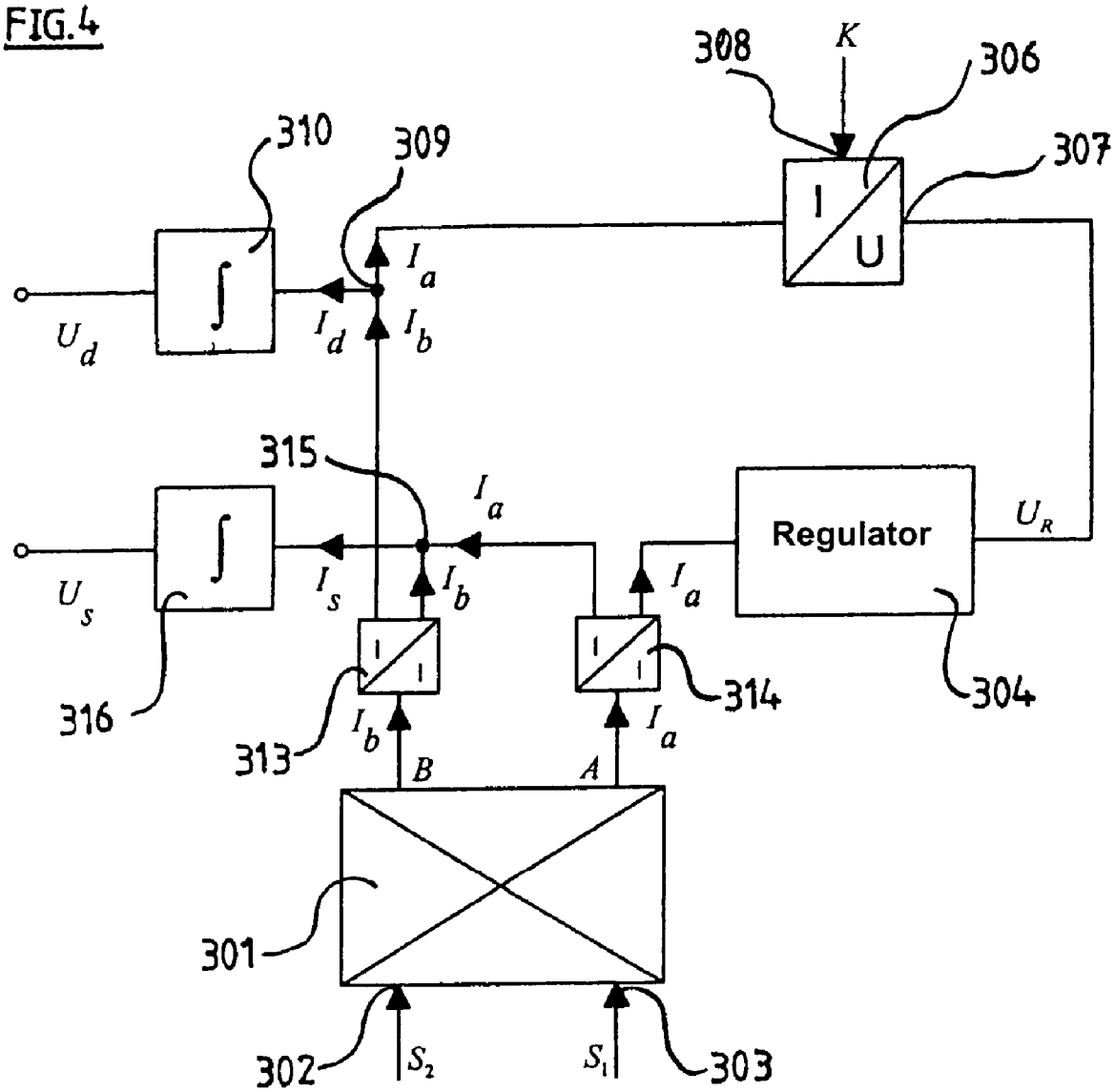
FIG. 4 shows a schematic circuit structure of a further version of the invention.

If on the other hand it is desired to obtain additional data about the uncorrelated signal constituents, the circuit from FIG. 4, which is slightly modified vis-à-vis FIG. 1, must be used. In this circuit, current replicators 313 and 314 are provided behind the signal outputs A and B of the mixer 301, which make the signal stream $I_a$ or $I_b$ available at two outputs. In each case one of the two outputs of the replicators 313, 314 is used as in FIG. 1 to form the difference between the two signal streams $I_a$ and $I_b$. The second output in each case of the replicators 313, 314 is passed to a second summation point 315, the two signal streams $I_a$ and $I_b$ having the same sign. The summed current signal $I_s$ flowing out from the second summation point 315 then corresponds to the sum of the currents $I_a$ and $I_b$, this sum having the non-correlated signal portions of the signal streams $I_a$ and $I_b$. If this current signal $I_s$ is integrated with an integrator 316, a voltage signal $U_s$ is obtained which is proportional to the sum of the two signal streams $I_a$, $I_b$ of the mixer 301.

The invention claimed is:

1. Method for processing at least two at least partially correlated output signal streams of a mixer, the mixer having at least two signal inputs and at least two electric signal outputs, characterized in that the difference of the output signal streams of the outputs of the mixer is formed pairwise directly and during the readout of the signal streams, characterized in that the signal stream of a first mixer output is converted, preferably with the help of a regulator, into a voltage signal dependent on the signal stream and the voltage signal is subsequently converted, preferably with the help of a voltage-to-current converter, into at least one current signal dependent on the voltage signal, the least one current signal being inverted to the signal stream and one of the current signals being passed together with the signal stream of a second mixer output to a first summation point.

2. Method according to claim 1, characterized in that one of the two current signals is integrated.

3. Method according to claim 1, characterized in that the regulator is controlled via a voltage applied to its voltage input.

4. Method according to claim 1 characterized in that the characteristic of the voltage-to-current converter is regulated via a control input.

5. Method according to claim 1, characterized in that the difference of the currents is integrated to form a voltage signal.

6. Method according to claim 1, characterized in that the signal streams of the first and the second mixer output are replicated and one of the two signal streams in each case of the two mixer outputs is passed to a second summation point.

7. Method according to claim 1, characterized in that the sum of the signal streams of the two mixer outputs is also formed.

8. Method according to claim 7, characterized in that the summed current signal is integrated to form a voltage signal.

9. Electronic circuit for processing at least two at least partially correlated output signal streams of a mixer, the mixer having at least two signal inputs and at least two electric signal outputs, characterized in that the circuit has an apparatus for the instantaneous formation of the difference between the signal streams of two mixer outputs in each case, characterized in that it has an apparatus, preferably a regulator, for converting the signal stream of a first mixer output into a voltage signal dependent on the signal stream and an apparatus, preferably a voltage-to-current converter, for converting the voltage signal into at least one current signal dependent on the voltage signal, the at least one current signal being inverted to the signal stream.

10. Electronic circuit according to claim 9, characterized in that the regulator can be controlled by a voltage applied to its voltage input.

11. Electronic circuit according to claim 9, characterized in that the characteristic of the voltage-to-current converter can be regulated via a control input.

12. Electronic circuit according to claim 9 characterized in that it has an apparatus for integrating one of the current signals dependent on the voltage signal.

13. Electronic circuit according to claim 9, characterized in that it has an apparatus for integrating the difference of the currents to form a voltage signal which is connected to the first summation point.

14. Electronic circuit according to claim 9, characterized in that a replicator each is provided for the signal streams of the two mixer outputs and one each of the outputs of the replicators is connected to a second summation point.

* * * * *

UNITED STATES PATENT AND TRADEMARK OFFICE
CERTIFICATE OF CORRECTION

PATENT NO.      : 7,574,190 B2
APPLICATION NO. : 11/098349
DATED           : August 11, 2009
INVENTOR(S)     : Xu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1164 days.

Signed and Sealed this

Seventh Day of September, 2010

David J. Kappos
*Director of the United States Patent and Trademark Office*